(12) United States Patent
Li

(10) Patent No.: US 10,412,858 B2
(45) Date of Patent: Sep. 10, 2019

(54) JOINT STRUCTURE BETWEEN ELECTRONIC COMPONENT AND FRAME

(71) Applicant: Yueh-Han Li, Guanshan Township (TW)

(72) Inventor: Yueh-Han Li, Guanshan Township (TW)

(*) Notice: Subject to any disclaimer, the term of this patent is extended or adjusted under 35 U.S.C. 154(b) by 0 days.

(21) Appl. No.: 15/965,899

(22) Filed: Apr. 28, 2018

(65) Prior Publication Data

US 2018/0324982 A1 Nov. 8, 2018

(30) Foreign Application Priority Data

May 2, 2017 (TW) .............................. 106114438 A

(51) Int. Cl.
| | | |
|---|---|---|
| *H05K 5/00* | (2006.01) | |
| *H05K 7/20* | (2006.01) | |
| *B62J 99/00* | (2009.01) | |
| *B60R 13/00* | (2006.01) | |
| *B62K 19/40* | (2006.01) | |

(52) U.S. Cl.
CPC ......... *H05K 7/20472* (2013.01); *B60R 13/00* (2013.01); *B62J 99/00* (2013.01); *B62K 19/40* (2013.01); *B62J 2099/004* (2013.01); *B62J 2099/0013* (2013.01)

(58) Field of Classification Search
CPC ....................................................... H05K 5/00
See application file for complete search history.

(56) References Cited

U.S. PATENT DOCUMENTS

| | | | |
|---|---|---|---|
| 2005/0122681 A1* | 6/2005 | Kitamura | ................. B62J 99/00 361/688 |
| 2016/0157334 A1* | 6/2016 | Koukami | ............ H01L 23/3737 361/705 |

FOREIGN PATENT DOCUMENTS

| | | |
|---|---|---|
| CN | 1627509 A | 6/2006 |
| CN | 106005183 A | 10/2016 |
| EP | 1542522 A2 | 6/2005 |
| JP | 2005174994 A | 6/2005 |
| TW | 200520186 A | 6/2005 |

* cited by examiner

*Primary Examiner* — Jerry Wu
(74) *Attorney, Agent, or Firm* — Guice Patents PLLC

(57) ABSTRACT

In a joint structure between an electronic component and a frame provided in the present invention, an electronic component is disposed in a frame, and heat is conducted from the electronic component to a corresponding windward part of the frame when a bicycle moves, so that the heat can be dissipated rapidly, thereby achieving a desirable heat dissipation effect.

14 Claims, 4 Drawing Sheets

JOINT STRUCTURE BETWEEN ELECTRONIC COMPONENT AND FRAME

BACKGROUND OF THE INVENTION

1. Field of the Invention

The present invention relates to bicycles, and in particular, to a joint structure between an electronic component and a frame.

2. Description of the Related Art

In the invention disclosure ROC No. 200520186, to provide an electronic part disposed on a bicycle with an appropriate heat dissipation effect, a housing is used to receive the electronic part, and a heat conduction component is disposed between the electronic part and the housing, so that heat generated by the electronic part disperses outwards from a part of the housing through the heat conduction component in contact with the electronic part, thereby achieving a heat dissipation effect.

Specifically, in the invention disclosure, the heat conduct ion component is sandwiched between the electronic part and one side surface of a cover board. At the same time, the opposite other side surface of the cover board faces a frame of the bicycle, and a bolt is then used as a joint element to join the cover board and the frame.

In this technology, an optimal heat dissipation effect cannot be achieved because in the overall structure, although heat generated by the electronic part can be transferred outwards through the heat conduction component indirect contact, after the heat is transferred to the cover board, there is no desirable technology of transferring heat outwards. As a result, heat excessively accumulates on the cover board, and therefore it is difficult to achieve an ideal heat dissipation effect.

SUMMARY OF THE INVENTION

Therefore, the main objective of the present invention is to provide a joint structure between an electronic component and a frame. By using the joint structure, heat generated by an electronic component can be transferred outwards, thereby achieving a desirable heat dissipation effect.

In view of this, to achieve the foregoing objective, in a joint structure between an electronic component and a frame provided in the present invention, an electronic component is disposed in a frame, and heat is conducted from the electronic component to a corresponding windward part of the frame when a bicycle moves, so that the heat can be dissipated rapidly, thereby achieving a desirable heat dissipation effect.

Furthermore, to ensure suitable conduction of the heat generated by the electronic component, a heat conduction layer is sandwiched between a circuit board of the electronic component and a cover part, and the cover part is located on a windward surface when the bicycle moves, thereby enabling heat generated on the electronic component to be transferred to the cover part through the heat conduction layer, and the cover part faces the wind when the bicycle moves to dissipate heat rapidly.

In the bicycle, the cover part, the electronic component, and the heat conduction layer included in the technical content of the joint structure between an electronic component and a frame, the bicycle further has amounting space provided on the frame, and an opening is formed corresponding to a windward direction when the bicycle moves. The cover part is fixedly disposed on the frame, and covers at least a part of the opening. The electronic component is accommodated in the mounting space, and the heat conduction layer is located between one side surface of the circuit board and the cover part.

The electronic component further includes at least one electronic part, protrusively disposed on the other side surface, opposite the cover part, of the circuit board, and located in the mounting space.

The material of the heat conduction layer may be a heat conduction material such as a heat conduction adhesive, and may further be soldering tin or the like that can further provide a joining force for joining the circuit board and the cover part.

Further, to make it easy to the join the cover part and the frame, the cover part is provided with a plate-shaped cover body abutting the heat conduct ion layer and a joint portion used to join the cover body and the frame.

In addition, the material of the cover part is aluminum Or aluminum alloy, so as to rapidly receive heat transferred by the heat conduction layer and also facilitate the processing of appearance, thereby improving the overall beauty.

DETAILED DESCRIPTION OF THE PREFERRED EMBODIMENTS

Further description is provided by using a preferred embodiment of the present invention with reference to the accompanying drawings.

Figure 1:
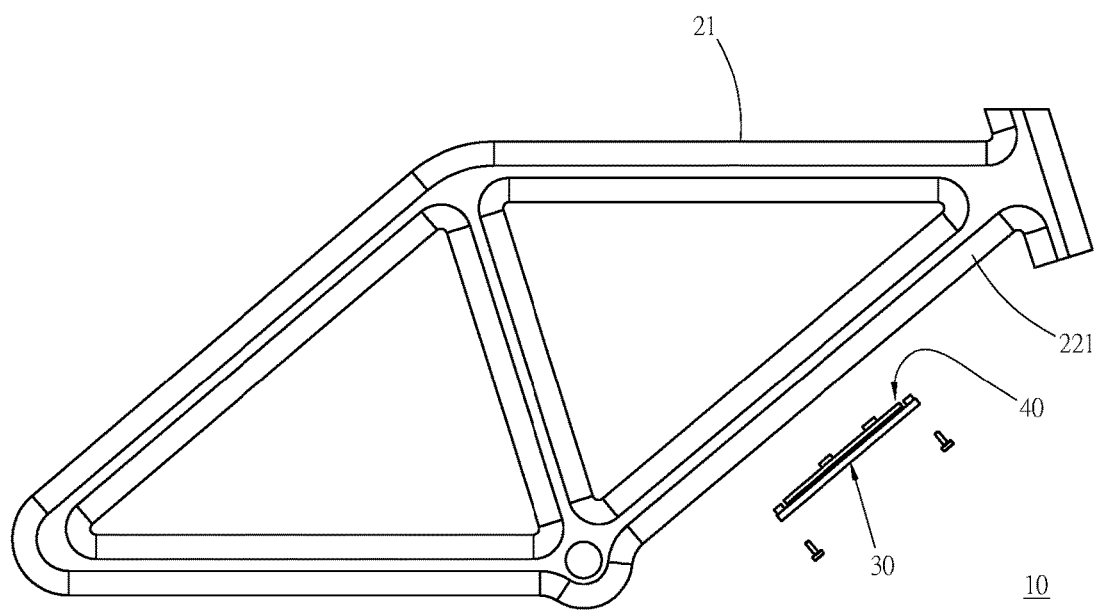
FIG. 1 is a planar exploded view according to a preferred embodiment of the present invention.
Figure 2:
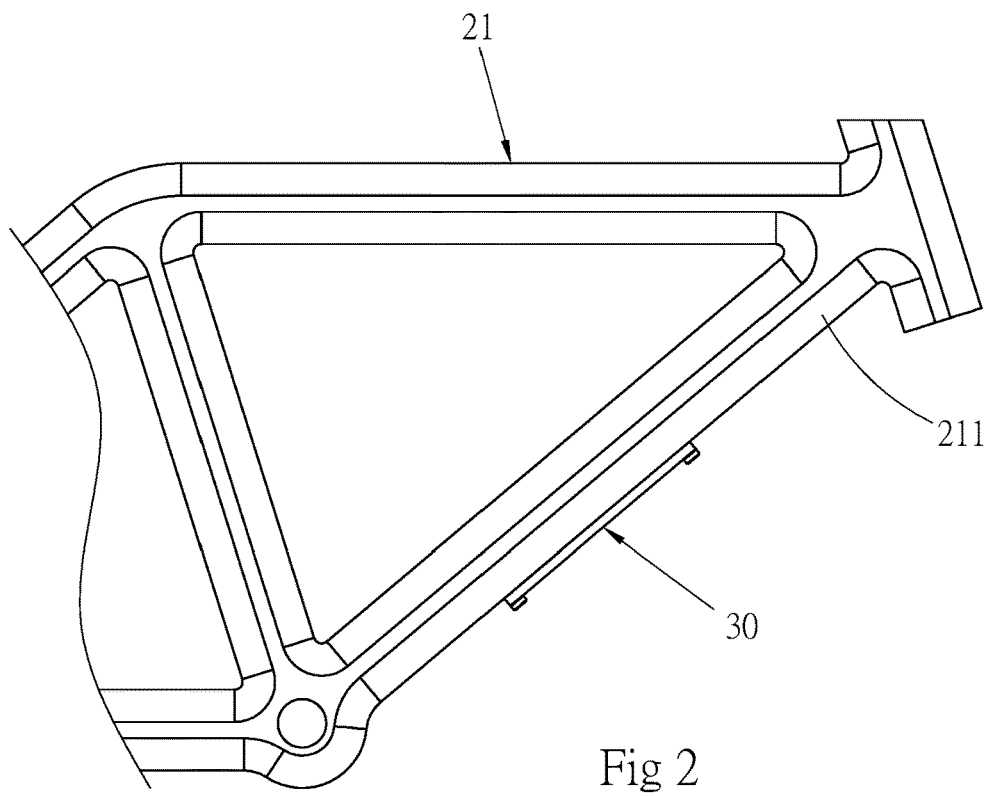
FIG. 2 is a planar combined view according to a preferred embodiment of the present invention.
Figure 3:
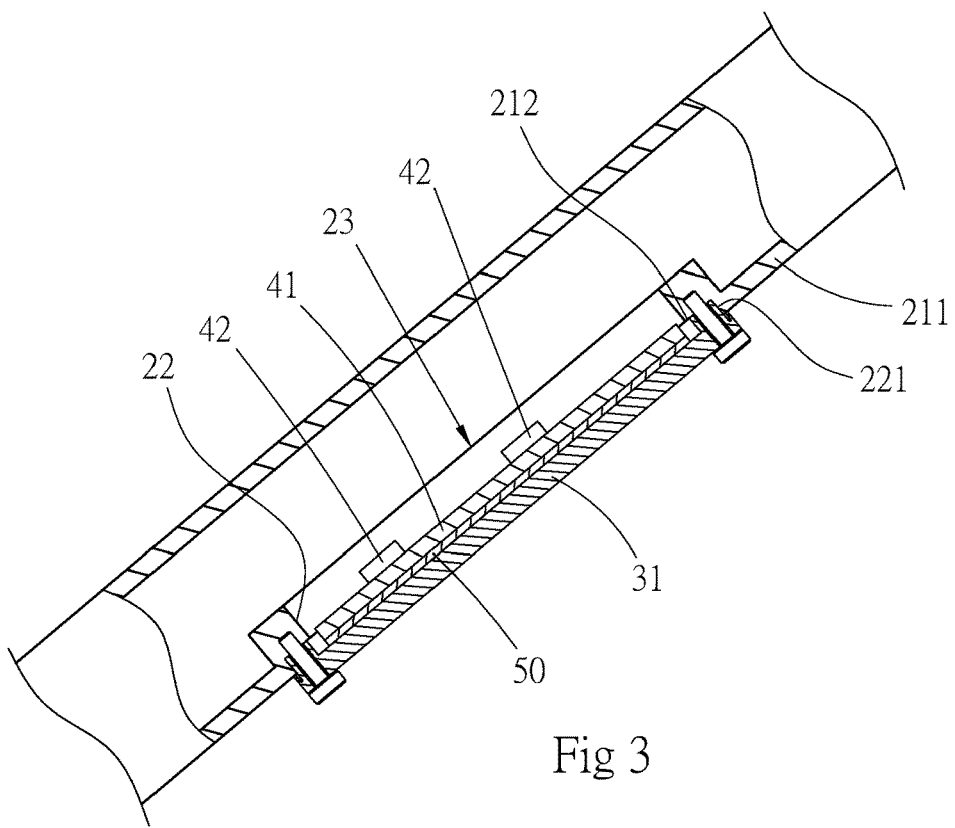
FIG. 3 is a sectional view according to a preferred embodiment of the present invention.
Figure 4:
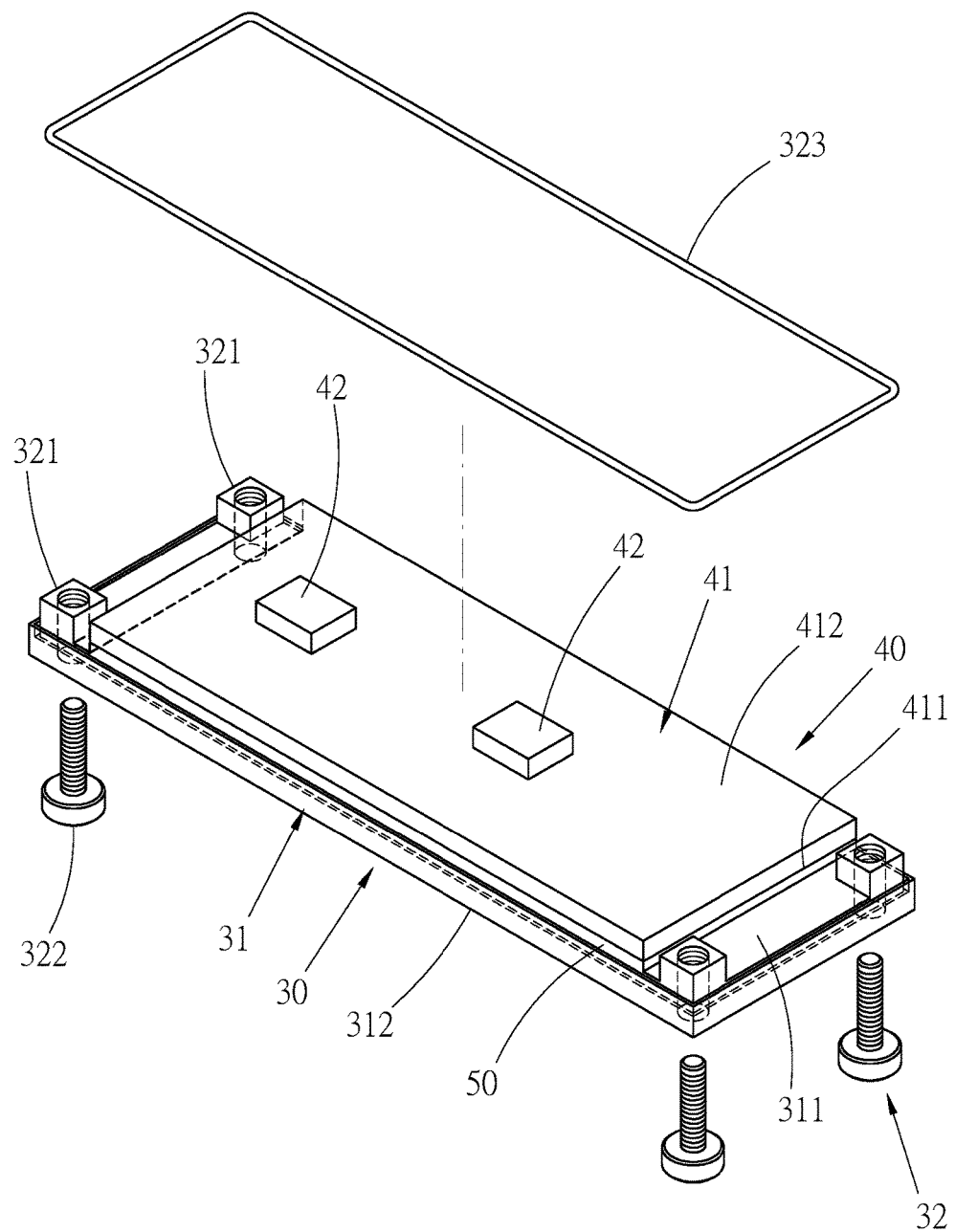
FIG. 4 is a three-dimensional view of a partial structure according to a preferred embodiment of the present invention.
Figure 5:
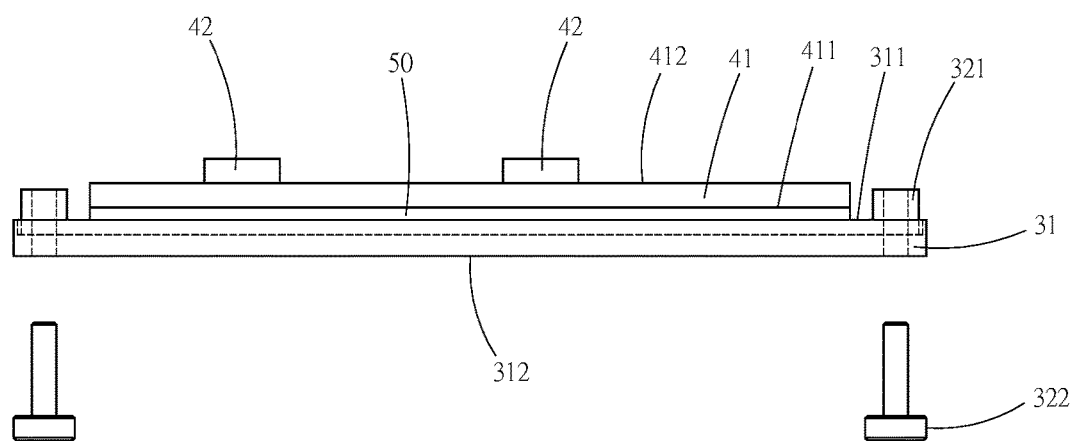
FIG. 5 is a side view of a partial structure according to a preferred embodiment of the present invention.

First, referring to FIG. 1 to FIG. 5, a joint structure (10) between an electronic component and a frame provided in a preferred embodiment of the present invention mainly includes a bicycle, a cover part (30), an electronic component (40), and a heat conduction layer (50).

The bicycle has a frame (21) with suitable strength. A through hole (22) penetrates a front-side part of a down tube (211) of the frame (21), so as to form an opening (221) on the frame (21) corresponding to a windward direction when the bicycle moves. The opening (221) and the internal space of the down tube (211) directly connected to the opening (221) together form a mounting space (23).

The cover part (30) has a plate-shaped cover body (31) made of aluminum. The size of the cover part (30) is suitable provided that the cover part (30) completely covers the opening (221). A circumferential side of one side surface (311) is attached to a corresponding part of the frame (21) on a circumferential side of the through hole (22), so as to close the opening (221) to isolate the mounting space (23) from outside. A joint portion (32) is disposed between the cover body (31) and the frame (21) and is used to fixedly connect the cover body (31) and the down tube (211).

The electronic component (40) is a move board of a power device in this embodiment and is accommodated in the mounting space (23), and is protected by the cover part (30) and the frame (21) to achieve isolation from outside. The electronic component (40) structurally has a plate-shaped circuit board (41). One side surface (411) of the electronic component (40) faces the side surface (311) of the cover body (31). A plurality of electronic parts (42) such as power devices protrude on the other side surface (412), opposite the cover body (31), of the circuit board (411), and are electrically connected to a circuit on the circuit board (41).

The heat conduction layer (50) uses soldering tin as a material and is located between the circuit board (41) and the cover body (31), and is attached to the side surface (411) of the circuit board (41) and the side surface (311) of the cover body (31), so as to form a heat transfer medium between the circuit board (41) and the cover body (31). The material of soldering tin of the heat conduction layer (50) may further be used to provide a joining force between the circuit board (41) and the cover body (31), so that the heat conduction layer (50), the circuit board (41), and the cover body (31) are adhered to each other and joined.

By using the foregoing component composition, the joint structure (10) between an electronic component and a frame enables the electronic component (40) to be mounted on a windward surface when the bicycle moves. By using a cooling effect of the cover body (31) facing the wind when the bicycle moves, when heat generated by the electronic component (40) is conducted to the cover body (31) through the heat conduction layer (50), the heat can be rapidly transferred into air. Compared with the defect that heat does not dissipate easily because heat is conducted to a leeward part of the bicycle in the technical content in the prior art, the present invention has a significant improvement in the effect and has an inventive step.

Furthermore, the heat conduction layer (50) is in full contact with the side surface (411) of the circuit board (41), and is attached to the cover body (31) through the same contact area. Therefore, heat generated by the parts on the electronic component (40) is separately and respectively conducted through the heat conduction layer (50) the cover body (31), thereby producing a better heat dissipation effect.

In addition, the heat conduction layer (50) is used as a heat conduction medium, and further provides a joining force for the circuit board (41) and the cover body (31), so that the electronic component (40) can be stably joined on the cover body (31).

Moreover, for the specific structure of the joint portion (32) used to join the cover body (31) and the down tube (211), a plurality of clamping blocks (321) are respectively protrusively disposed on the side surface (311) of the cover body (31), so as to be clamped to a plurality of clamping grooves (212) provided on the down tube (211) of the frame (21). The cover body (31) can be rapidly fastened to the frame (21) and positioned. A plurality of joint bolts (322) are respectively threaded between the clamping blocks (321) and parts, corresponding to the clamping grooves (212), of the down tube (211), so as to provide forces required for joining the clamping blocks (321) and parts. A seal ring (323) is inserted in the side surface (311) of the cover body (31) and is sealed with the down tube (211), thereby preventing external vapor from entering the mounting space (23) through the opening (221) to protect the normal operation of the electronic component (40) from being affected.

In addition, the cover body (31) made of aluminum has a desirable heat conduction effect, and in addition, suitable surface treatment can further be performed on the other side surface (312), exposed from the frame (21), of the cover body (31), to endow the other side surface (312) with colors, patterns or other design shapes, so as to improve the visual beauty of the appearance. Certainly, additional heat dissipation fins may further be added on the other side surface (312) of the cover body (31), so as to further improve a heat dissipation effect. Any simple additional changes or equivalent replacements made based on the technical features of the present invention fall within the protection scope of the present invention.

In addition, although a bicycle is used as an example in the embodiment disclosed above, the technical content of the present invention can also be applied to a vehicle such as a motorcycle having a frame during implementation.

REFERENCE NUMERALS

(10) Joint structure between an electronic component and a frame (21) Frame (211) Down tube (212) Clamping groove (22) Through hole (221) Opening (23) Mounting space (30) Cover part (31) Cover body (311) One side surface of cover body (312) Other side surface of cover body (32) Joint portion (321) Clamping block (322) Joint bolt (323) Seal ring (40) Electronic component (41) Circuit board (411) One side surface of circuit board (412) Other side surface of circuit board (42) Electronic part (50) Heat conduction layer

What is claimed is:

1. A joint structure between an electronic component and a frame, comprising:
    a vehicle, having the frame and a mounting space provided in the frame, an opening being formed on a down tube surface of the frame facing opposite to a corresponding windward direction when the vehicle moves;
    a cover part, fixedly disposed on the down tube surface of the frame, and covering all of the opening;
    an electronic component, accommodated in the mounting space and the opening, and having a plate-shaped circuit board, one side surface of electronic component facing the cover part, and at least one electronic part being protrusively disposed on the other side surface, opposite the cover part, of the circuit board;
    a heat conduction layer, being received the mounting space and located between the side surface of the electronic component and the cover part;
    a seal ring being inserted on a side surface of the cover part and located around the circuit board; and
    a joint portion secure the cover to the frame and seal the entire opening through the seal ring.

2. The joint structure between an electronic component and a frame according to claim 1, wherein the heat conduction layer joins the circuit board and the cover part.

3. The joint structure between an electronic component and a frame according to claim 2, wherein the material of the heat conduction layer is soldering tin.

4. The joint structure between an electronic component and a frame according to claim 1, wherein the material of the heat conduction layer is soldering tin.

5. The joint structure between an electronic component and a frame according to claim 1, wherein the mounting space is a hole.

6. The joint structure between an electronic component and a frame according to claim 1, wherein the mounting space is a groove.

7. The joint structure between an electronic component and a frame according to claim 1, wherein the cover part covers the entire opening.

8. The joint structure between an electronic component and a frame according to claim 7, wherein the cover part is plate-shaped.

9. The joint structure between an electronic component and a frame according to claim 8, wherein the material of the cover part is aluminum or aluminum alloy.

10. The joint structure between an electronic component and a frame according to claim 8, wherein the cover part has a plate-shaped cover body, the joint portion is disposed between the cover body and the frame, and the cover body is fixedly connected on the frame.

11. The joint structure between an electronic component and a frame according to claim 1, wherein the cover part is plate-shaped.

12. The joint structure between an electronic component and a frame according to claim 11, wherein the material of the cover part is aluminum or aluminum alloy.

13. The joint structure between an electronic component and a frame according to claim 11, wherein the cover part has a plate-shaped cover body, the joint portion is disposed between the cover body and the frame, and the cover body is fixedly connected on the frame.

14. The joint structure between an electronic component and a frame according to claim 1, wherein the electronic part is a power device.

* * * * *